United States Patent [19]

Masuda et al.

[11] 4,243,975

[45] Jan. 6, 1981

[54] ANALOG-TO-DIGITAL CONVERTER

[75] Inventors: Eiji Masuda, Kawasaki; Yasoji Suzuki, Ayase, both of Japan

[73] Assignee: Tokyo Shibaura Denki Kabushiki Kaisha, Japan

[21] Appl. No.: 945,641

[22] Filed: Sep. 25, 1978

[30] Foreign Application Priority Data

Sep. 30, 1977 [JP] Japan .................. 52/117533

[51] Int. Cl.$^2$ ............................................. H03K 13/20
[52] U.S. Cl. ...................... 340/347 NT; 340/347 AD
[58] Field of Search ................. 340/347 NT, 347 AD, 340/347 CC

[56] References Cited

U.S. PATENT DOCUMENTS

| | | | |
|---|---|---|---|
| 3,828,347 | 8/1974 | Sacks | 340/347 AD |
| 3,872,466 | 3/1975 | Wold | 340/347 NT |
| 3,906,486 | 9/1975 | Phillips | 340/347 NT |
| 3,942,173 | 3/1976 | Wold | 340/347 NT |
| 4,063,236 | 12/1977 | Amemiya | 340/347 NT |

FOREIGN PATENT DOCUMENTS 51-48258 4/1976 Japan .
51-48261 4/1976 Japan .

OTHER PUBLICATIONS

Analog Devices Data Sheet, "CMOS 13-Bit Monolithic Aid Converter", date unknown, pp. 1-8.

*Primary Examiner*—Charles D. Miller
*Attorney, Agent, or Firm*—Finnegan, Henderson, Farabow, Garrett & Dunner

[57] ABSTRACT

A first reference voltage, a second reference voltage and an unknown analog signal with the same polarity with respect to that of the first reference voltage are applied in a given sequence to the second input of an integrator whose first input is supplied with a voltage which is half the difference between the first and second reference voltages. The output of the integrator is coupled with the second input of a comparator whose first input is supplied with a medium voltage between the second reference voltage and the input voltage at the first input of the integrator as a comparing reference voltage. At the beginning of conversion, the integrator initiates integration from the comparing reference voltage level. During first and second periods each having a given duration, the second reference voltage and the unknown analog signal are sequentially applied to the second input of the integrator. During a third period, the first reference voltage is applied to the second input of the integrator. A first counter counts clock pulses with a given frequency during the third period to thereby provide a digital value corresponding to the unknown analog signal. When the magnitude of the unknown analog signal is slightly smaller than the first reference voltage and when it is slightly larger than the second reference voltage, a digital value corresponding to the difference between the magnitudes of the unknown analog signal and the reference voltage is measured by a second counter. In another embodiment of the invention, one calibration cycle is executed for a series of conversion cycles of unknown analog signals. In the calibration cycle, a digital value, which includes an error due to an input offset voltage of the integrator, corresponding to the first of second reference voltage, is measured. The measured digital value of each unknown analog signal is calibrated depending on the difference between the measured digital value for a reference voltage including the error and a known correct digital value for the reference voltage.

8 Claims, 11 Drawing Figures

ANALOG-TO-DIGITAL CONVERTER

BACKGROUND OF THE INVENTION

1. Field of the Invention

This invention relates to an analog-to-digital converter and, more particularly, to an improvement of a dual-slope integrating analog-to-digital converter.

2. Description of the Prior Art

Figure 1:
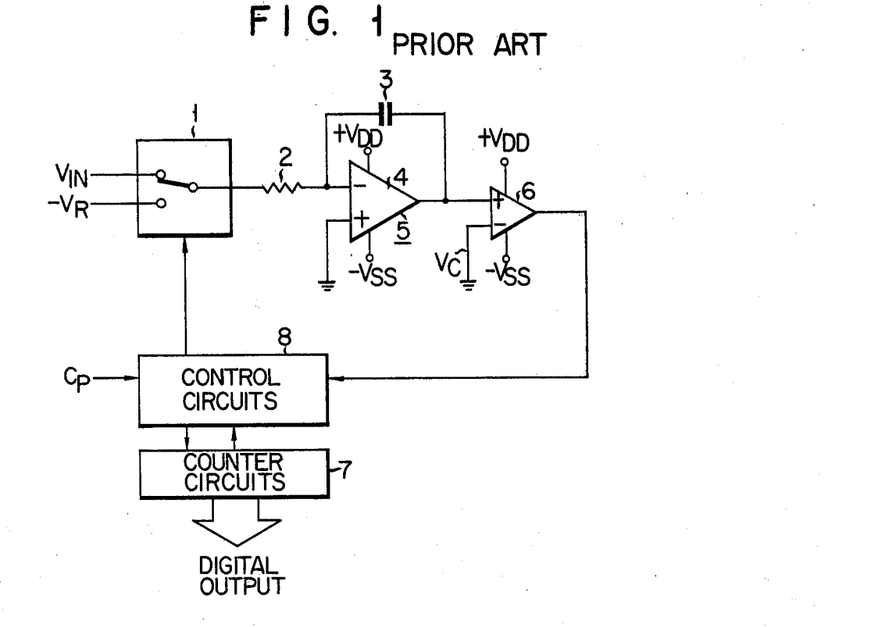
FIG. 1 is a schematic block diagram showing a form of prior art A-D converter.
Figure 2:
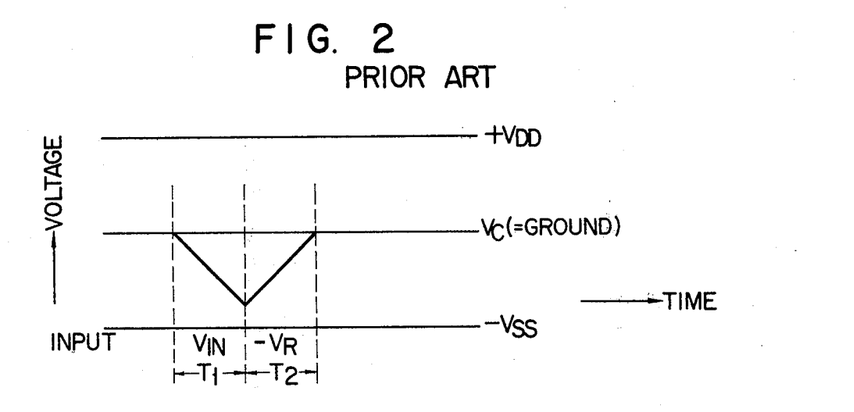
FIG. 2 shows a waveform for explaining the operation of the A-D converter of FIG. 1.

FIG. 1 shows a schematic block diagram of a typical conventional dual-slope integrating analog-to-digital converter (referred to as an A-D converter). FIG. 2 shows a waveform for illustrating the operation of the A-D converter. In the conventional A-D converter, an unknown analog voltage $V_{IN}$ is applied through a switch circuit 1 to an integrator circuit 5 comprised of a resistor 2, a capacitor 3, and an operational amplifier 4 and integrated during a given time interval T1. Then the switch 1 is operated to cause the integrator 5 to integrate a reference voltage $-V_R$ with the opposite polarity to the analog input voltage $V_{IN}$. A counter circuit 7 counts a time interval T2 from the end of the time interval T1 to a point of time at which the output of the integrator 5 reaches a threshold voltage (comparison reference voltage) Vc applied to the inverting input of a comparator 6 whose noninverting input is connected to the output of the integrator 5. A control circuit 8 in FIG. 1 controls the switching operation of the switch circuit 1 and responds to the output of the comparator 6 to transfer a clock pulse Cp to the counter circuit 7. In general, ground voltage is applied to the noninverting input terminal of the integrator 5, and the comparison reference voltage Vc applied to the comparator 6 is ground voltage, as shown in FIG. 1.

In the abovementioned A-D converter, the unknown analog voltage $V_{IN}$ and the digital amount T2 obtained after the A-D conversion are related by $$V_{IN} = T2/T1 \times V_R \quad (1)$$

Equation (1) shows that, if the time interval T1 and the reference voltage $-V_R$ are previously known and the time interval T2 is measured by using the clock pulse Cp, the digital value corresponding to the unknown analog voltage $V_{IN}$ is obtained.

The conventional A-D converter system has some disadvantages as listed below.

1. The reference voltage $-V_R$ and the unknown analog voltage $V_{IN}$ must be opposite in polarity. This condition imposes a great restriction on designing of the A-D converter. Particularly, this makes it impossible to realize a ratiometric conversion having an extensive application.
2. Since ground potential is coupled with the noninverting input terminal of the integrator 5, the integrator 5 needs two drive power sources (positive and negative). The same condition is applicable for the comparator 6. The need of two power sources for the A-D converter increases cost and is disadvantageous in many system applications. Particularly, when it is used as an A-D converter in a data collection system using a microcomputer, recently finding a wide application, and is integrated on a semiconductor substrate, the conventional A-D converter is impracticable because the microcomputer system is generally driven by only a single power source.
3. The range where the conventional A-D converter can convert the unknown analog input voltage $V_{IN}$ from its analog form to digital form extends generally from ground to the reference voltage $|V_R|$. As seen from the integration waveform in FIG. 2, when the analog input voltage $V_{IN}$ is extremely close to ground voltage, the integration waveform remains close by the threshold voltage level Vc of the comparator 6 during the period T1. Therefore, the input condition of the comparator 6 becomes very unstable and thus the A-D converter is liable to malfunction. As a result, a high precision A-D conversion cannot be expected. Additionally, when the analog input voltage $V_{IN}$ is slightly lower than ground voltage, the A-D converter cannot carry out an A-D conversion of such an analog voltage.
4. In the conventional A-D converter, due to an offset Vos in the input voltage, which is inherent to the operational amplifier 4 in the integrator 5, a high precision A-D conversion is impossible. In order to obtain high precision data, therefore, additional circuit means must be used so as to eliminate the error resulting from the offset voltage. One approach is to manually adjust the offset voltage to zero for each A-D conversion. Another approach is that the offset voltage is stored in a relatively large capacitor and the stored voltage is superimposed on the voltage to be integrated so as to effectively eliminate the influence of the offset voltage. However, when the A-D converter is used in a data collecting system as mentioned above, manual operation is unsuitable for system maintenance. Further, the use of the capacitor increases the number of parts and thus its manufacturing cost becomes high.

OBJECTS AND SUMMARY OF THE INVENTION

Accordingly, an object of the invention is to provide an A-D converter which is very useful when it is used in a data collecting system using a microcomputer and is readily integrated on a semiconductor substrate.

Another object of the invention is to provide an A-D converter in which, with respect to a first reference voltage, a second reference voltage and an unknown analog voltage $V_{IN}$ are of the same polarity.

Still another object of the invention is to provide an A-D converter which is driven by a single power supply voltage with the same polarity as that of a second reference voltage with respect to a first reference voltage.

Still another object of the invention is to provide an A-D converter which is capable of a ratiometric conversion.

Yet another object of the invention is to provide an A-D converter in which an unknown analog input voltage $V_{IN}$ between first and second reference voltages is A-D converted at a high precision, and particularly where unknown analog voltages near both the reference voltages are A-D converted stably and precisely, and wherein even when the unknown analog input voltage $V_{IN}$ falls outside the range between both the reference voltages $V_{IN}$ is stably and precisely A-D converted if an exceeding voltage value is within a given range and the exceeding voltage value is outputted in a digital value.

A further object of the invention is to provide an A-D converter in which a first or a second reference voltage is A-D converted once per a series of conversions of analog input voltages and a measured digital amount for the A-D converted reference voltage is stored and the digital values of the analog voltages are calibrated by using a given calibrating equation to thereby compensate for an offset voltage error.

These and other objects as well as the features of the invention will become apparent by reading the following detailed description when taken in conjunction with the accompanying drawings.

DESCRIPTION OF THE PREFERRED EMBODIMENTS

Figure 3:
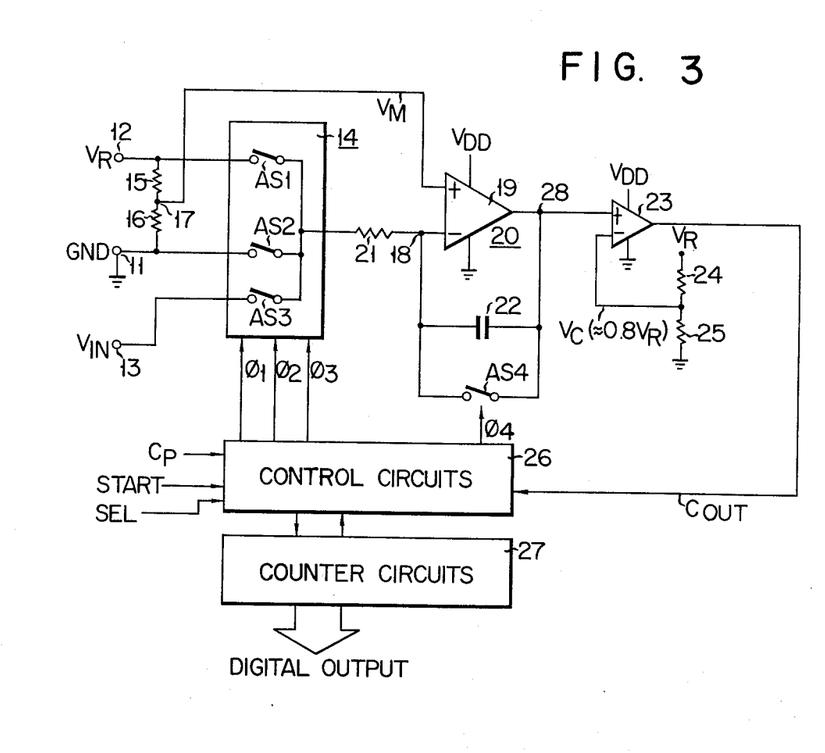
FIG. 3 is a schematic block diagram showing an A-D converter according to one embodiment of the invention.

Reference is made to FIG. 3 illustrating an embodiment of an A-D converter according to the invention. The A-D converter is driven by a single power source $V_{DD}$ with a positive polarity, for example. A first reference voltage is applied to a terminal 11. In the example, the first reference voltage is the ground voltage GND. A second reference voltage $V_R$ is applied to a terminal 12. In this example, the second reference voltage $V_R$ is equal in magnitude to the power source voltage $V_{DD}$. An unknown analog input voltage $V_{IN}$ is applied to a terminal 13. An electronic switch circuit 14 is comprised of analog switches AS1 to AS3 whose outputs are commonly connected to one end of an integrating resistor 21. The analog switches AS1 to AS3 are controlled by control signals $\phi 1$ to $\phi 3$ respectively. The analog switch AS1 is enabled (closed) when the control signal $\phi 1$ is at a HIGH level and is disabled (open) when the signal $\phi 1$ is at a LOW level. Analog switches AS2 and AS3 operate in a similar manner relative to the control signals $\phi 2$ and $\phi 3$. In this description, the HIGH voltage level may be considered to correspond to the power supply voltage $V_{DD}$ and the LOW voltage level to the ground voltage.

As shown, an operational amplifier 19 is driven by the single power supply $V_{DD}$. The inverting input terminal (−) is connected to the other end of the integrating resistor 21. An integration capacitor 22 is connected between the inverting input termnal (−) and the output terminal of the operational amplifier 19. The operational amplifier 19, the integrating resistor 21 and the integrating capacitor 22 cooperate to form an integrator circuit 20. Between the terminals 11 and 12 a pair of resistors 15 and 16 with the same resistance value are connected in series. An intermediate voltage $V_M (=\frac{1}{2} V_R)$ is derived from a connection point 17 between the resistors 15 and 16. The intermediate voltage $V_M$ is applied to the non-inverting input terminal (+) of the integrator circuit 20.

Connected across the integrating capacitor 22 is an analog switch AS4 which is controlled by a control signal $\phi 4$. The analog switch AS4 is enabled by the HIGH level of control signal $\phi 4$, and disabled by the LOW level of control signal $\phi 4$.

The output terminal 28 of the integrator circuit 20 is connected to one of the input terminals of the comparator 23 driven by the single power supply $V_{DD}$. To the other input terminal of the comparator 23 is applied a threshold voltage Vc derived from a connection point between two resistors 24 and 25 connected in series between sources of the first and second reference voltages GND and $V_R$. The resistors 24 and 25 may be selected so that the threshold voltage Vc applied to the comparator 23 is approximately 80% of the reference voltage $V_R$. As will be described later, the absolute value of the threshold voltage Vc does not influence the precision of A-D conversion.

The magnitude of comparison reference voltage Vc applied to the comparator 23 may be within a range of voltage levels under which the comparator 23 is not saturated and operates stably. In this embodiment of the invention, the comparison reference voltage Vc may be within a range from ground voltage to the supply voltage $V_{DD}$ and thus is not limited to 0.8 $V_R$.

The comparator 23 is a so-called cross detector and its output $C_{out}$ changes from LOW to HIGH level when the output of the integrator 28 upwardly crosses the threshold level Vc. Conversely, when the integrator output 28 downwardly crosses the threshold voltage Vc, the output $C_{out}$ changes from HIGH to LOW level.

A clock pulse Cp with a fixed frequency, a START signal of the A-D conversion, a conversion selection signal SEL, the output signal $C_{out}$ of the comparator 23, and signals representing contents of a counter circuit 27 are applied to a control circuit 26. In response to these signals, the control circuit 26 produces control signals for controlling the analog switches AS1 to AS4 and the counter 27.

The counter circuit 27 counts the clock pulse Cp under control of the control circuit 26 and delivers the count outputs to the control circuit 26, and also provides the digital output of the unknown analog signal $V_{IN}$.

Figure 4:
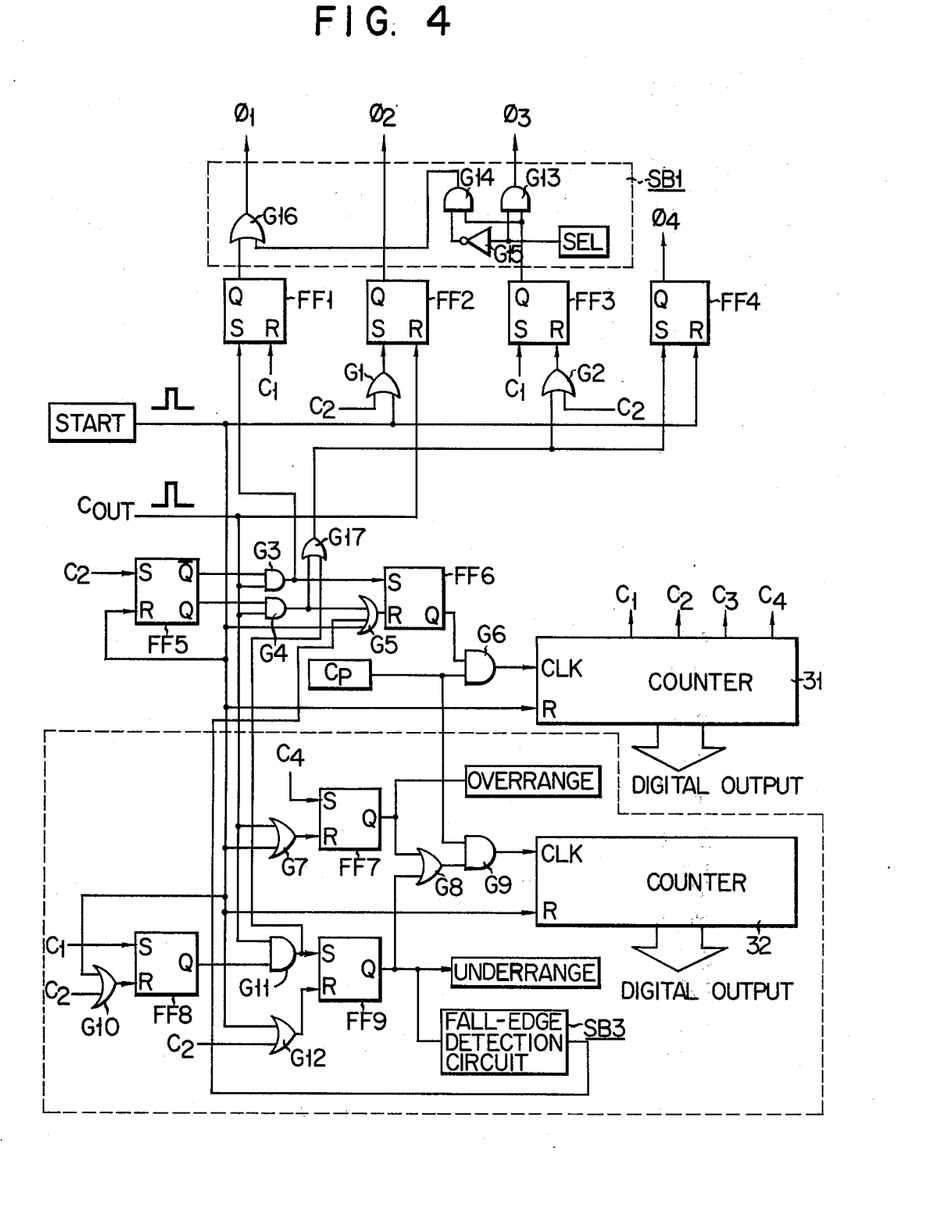
FIG. 4 is a circuit diagram illustrating the counter and control circuits used in the A-D converter of FIG. 3.

The details of the counter circuit 27 and the control circuit 26 will be described with reference to FIG. 4. In the figure, flip-flop circuits FF1 to FF9 are each an R-S flip-flop with a reset input. Gate circuits G1, G2, G5, G7, G8, G10, G12, G16, and G17 are each an OR gate. Gate circuits G3, G4, G6, G9, G11, G13, and G14 are each an AND gate. A counter circuit 31 has a clock input terminal CLK, a reset input terminal R and output terminals C1 to C4 and provides a digital value of the analog voltage signal being measured. When a HIGH level signal is applied to the reset input terminal R of the counter 31, the counter is cleared to zero, and then starts counting the clock pulses Cp applied to the clock input terminal CLK. When a given number of clock pulses is counted, a first timing control pulse signal with a HIGH level appears at the output terminal C1. Further, when the counter counts said given number of clock pulses from that time at which the first timing control signal is produced, the counter produces at the output terminal C2 a second timing control pulse signal with HIGH level. In this same manner, the counter 31 successively produces at the output terminals C3 and C4 third and fourth HIGH level timing control signals at subsequent time intervals corresponding to said given number of clock pulses. When the fourth timing control signal is produced, the counter returns to its initial state and then repeats a similar operation. The counter 31 may be constructed by using a ripple carry type binary counter and some additive gate circuits.

The counter circuit 32 may be similar to the counter circuit 31 and is provided with a clock input terminal CLK and a reset terminal R and provides a count number in digital form. The full scale count of the counter circuit 32 may be smaller than that of the counter 31. A selection circuit block SB1 is comprised of OR gate G16, AND gates G13 and G14 and an inverter G15. In the selection circuit block SB1, when the conversion selection signal SEL is HIGH, the output of the flip-flop FF3 is used as the control signal $\phi 3$ for the analog switch AS3 through the gate G13. When the conversion selection signal SEL is LOW, the output signal of the flip-flop FF3 is used as the control signal $\phi 1$ for the analog switch AS1 via gates G14 and G16.

The operation of the A-D converter thus far described will be given with reference to FIGS. 4 and 5.

Figure 5:
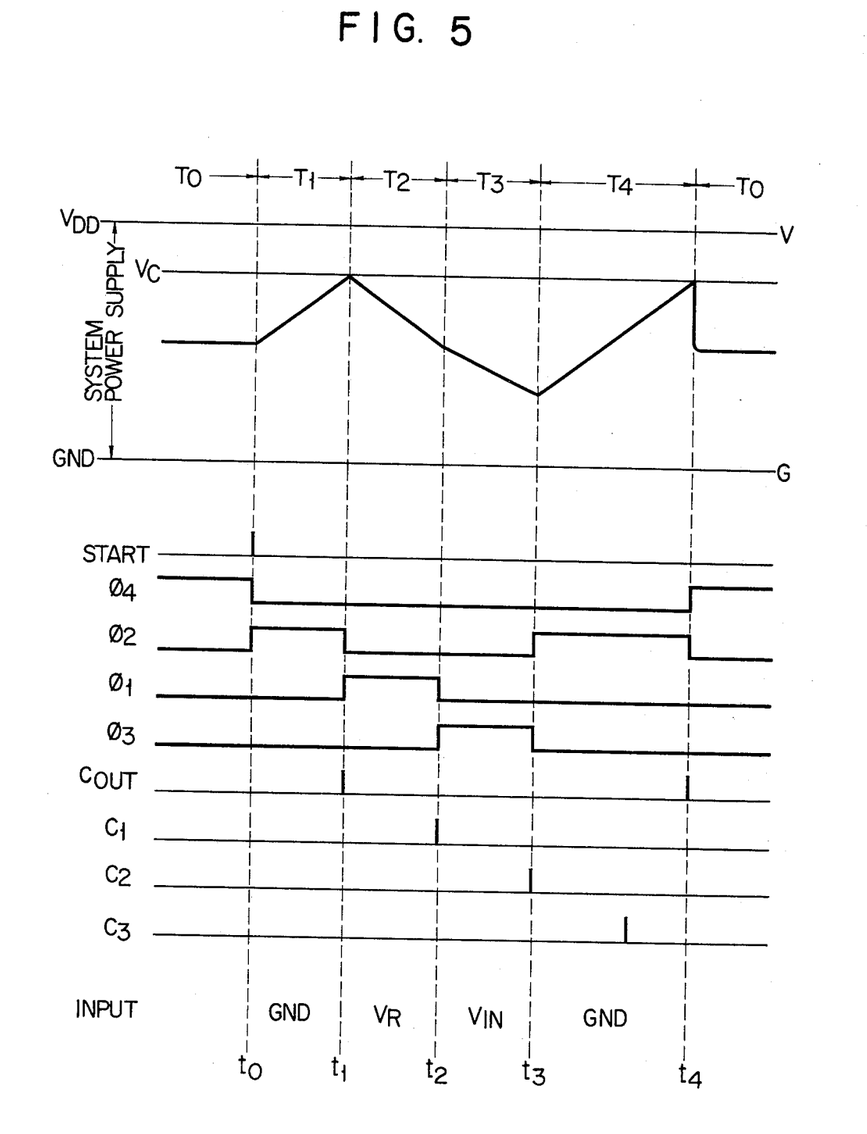
FIG. 5 shows a set of waveforms useful in explaining the operation of the A-D converter of FIG. 3.

An integration waveform in FIG. 5 shows one cycle of A-D conversion wherein an unknown analog input voltage $V_{IN}$ is relatively close to the reference voltage $V_R$. In the A-D conversion cycle, the conversion selection signal SEL in the conversion selection circuit block SB1 is HIGH.

During a period To, the integrator circuit 20 is in an idle state prior to the A-D conversion and operates as a voltage follower. The outputs of the flip-flops FF1 to FF4 are assumed to have been in placed in appropriate output states to retain the voltage follower. Namely, the control signal $\phi 4$ is HIGH (thus the analog switch AS4 is enabled) and the control signals $\phi 1$ to $\phi 3$ are all LOW (thus the analog switches AS1 to AS3 are all disabled). At this time, the intermediate voltage $V_M$ is applied to the non-inverting input terminal (+) of the operational amplifier 19 (FIG. 3), and the inverting input is directly coupled with the output, so that the applied voltage $V_M$ appears at the output terminal 28.

As shown in FIG. 5, when a conversion initiating pulse signal START of HIGH level is applied at time point $t_o$, the flip-flops FF4 to FF9 in the control circuit 26 are all reset, and the flip-flop FF2 is set. Accordingly, the integrator circuit 20 is released from the voltage follower state, the analog switch AS2 is enabled (closed) and the first reference voltage, or the ground voltage GND, is applied to the integrator circuit 20. Since the medium voltage $V_M (\frac{1}{2} V_R)$ is always applied to the non-inverting input of the integrator circuit 20, the integration circuit 2o integrates the difference between the medium voltage $\frac{1}{2} V_R$ and the first reference voltage 0 V. The output of the integrator circuit 20 increases with a positive slope of $(\frac{1}{2} V_R - 0)/RC$ where R is the resistance of the resistor 21 and C is the capacitance of the integrating capacitor 22. When the output of the integrator circuit 20 reaches the threshold level Vc of the comparator 23 (at time $t_1$), the output $C_{out}$ of the comparator is changed from LOW to HIGH level and at this time the time period T1 shifts to the succeeding time period T2. The object of provision of the time period T1 from time $t_o$ to time $t_1$ is: (a) to initially preset the integrator output at the threshold voltage Vc at the beginning of integration for measurement, and (b) to eliminate count error arising from a propagation delay of the comparator by equalizing the input conditions of the comparator at the begining and the end of measurement. In other words, the latter object of the period T1 is to cause the output of the integrator to cross the threshold level Vc from the same side at the ends of the time periods T1 and T4.

The operation of the circuit during the time period T2 will be described below. In FIG. 4, when the comparator output $C_{out}$ goes HIGH, the flip-flop FF2 is reset, and the flip-flop FF1 is set through the AND gate G3 which has been enabled by the HIGH level output $\bar{Q}$ of the flip-flop FF5, with the result that the analog switch AS1 is enabled and the switch AS2 is disabled. Accordingly, the second reference voltage $V_R$ is inputted to the integrator circuit 20 and thus the integrator circuit 20 integrates the difference between the medium voltage $V_M (\frac{1}{2} V_R)$ and the reference voltage $V_R$. The output voltage of the integrator 20 decreases with a negative slope of $(\frac{1}{2} V_R - V_R)/RC$, as shown in FIG. 5. In the control circuit section 26, the output $C_{out}$ of the comparator 23 sets the flip-flop FF6 at the beginning of the period T2 to enable the gate C6. As a result, the clock pulse CP is applied to the counter 31 so that the counter 31 initiates its counting operation. The content of the counter 31 at the start of counting is zero because it has been cleared by the start signal START at time to. Accordingly, when the counter 31 counts a predetermined number from time $t_1$ to time $t_2$, it produces the first timing control pulse C1 at time $t_2$. The predetermined number of counts is designated T for the sake of explanation. Accordingly when the counter 31 counts the number T, the flip-flop FF1 is reset, and the flip-flop FF3 is set by the control pulse $C_1$. As a result, the period T2 terminates and the period T3 starts during which the analog switch AS3 is enabled and the analog switch AS1 is disabled. During the period the unknown analog signal $V_{IN}$ is applied to the integrator in place of the second reference voltage $V_R$. Therefore, the integrator circuit 20 integrates the difference between the intermediate voltage $V_M (\frac{1}{2} V_R)$ and the unknown analog input voltage $V_{IN}$. The slope of the integrator output is $(\frac{1}{2} V_R - V_{IN})/RC$ and the integrator output rises or falls depending on the magnitude relation between the unknown analog input voltage $V_{IN}$ and the intermediate voltage $V_M$.

The counter 31 continues counting of the clock pulse Cp and upon counting the predetermined count T from the point of time $t_2$, the counter 31 produces the second timing control pulse C2 (at time $t_3$). The pulse C2 sets the flip-flop FF2 and resets the flip-flop FF3. Accordingly, at this time the analog switch AS2 is enabled and the switch AS3 is disabled, so that the period T3 terminates and the succeeding period T4 starts. The integrator input voltage is changed from the unknown analog input voltage $V_{IN}$ to the first reference voltage GND. During the period T4, the integrator circuit 20 integrates the difference between the medium voltage $V_M$ ($\frac{1}{2} V_R$) and the first reference voltage GND. At this time, the integrator output voltage rises with a positive slope of $(\frac{1}{2} V_R - 0)/RC$. As in the period T1, the period T4 terminates at a time $t_4$ when the integrator output crosses the threshold voltage Vc of the comparator 23. During the period T4, the counter 31 further counts the clock pulse and at time $t_4$ the comparator output $C_{out}$ is changed from LOW level to HIGH level. As a result, the output of the gate G4 which had been enabled by the output Q of the flip-flop FF5 which had been set by the second timing control pulse C2 resets the flip-flop FF6 to disable the gate G6. Consequently, the supply of the clock pulse $C_p$ to the counter 31 is inhibited. Accordingly, the count number of the counter 31 at that time represents a digital amount corresponding to the unknown analog input voltage $V_{IN}$. In short, the time period T4 is a measuring period. At time $t_4$, the flip-flop FF3 is reset and the flip-flop FF4 is set. Accordingly, the analog switch AS4 is enabled and the switch AS3 is disabled. Electric charge stored in the integrating capacitor 22 is discharged through the analog switch AS4 and the the integrator output 28 becomes the voltage $V_M$ which is impressed to the non-inverting input terminal and the integrator returns to the voltage follower state as in the period To, resulting in termination of the integration. In the above-mentioned embodiment, the counter 31 is used for the purposes of providing timing control pulses and the digital value. However, separate counters may be provided for those respective purposes.

The explanation to follow is how the unknown analog input voltage $V_{IN}$ is converted into a corresponding digital value.

As described above, the duration of each of the periods T2 and T3 correspond to the count T. It is assumed that the count number of counter 31 corresponding to the duration of the time period T4 is N. From the condition that the output of the integrator 20 is at the level Vc at the end ($t_1$) of the period T1 and at the end ($t_4$) of the period T4, we have $$\frac{-\frac{1}{2}V_R}{RC} T + \frac{\frac{1}{2}V_R - V_{IN}}{RC} T + \frac{\frac{1}{2}V_R}{RC} N = 0$$

Upon rearranging the above equation, $V_{IN}$ is obtained as follows.

$$V_{IN} = (N/2T) \times V_R \qquad (2)$$

Thus, the ratio of the unknown analog input voltage to the difference $V_R$ between two reference voltages is obtained. Therefore, if the durations of the periods T2 and T3 are previously set (corresponding to the number 2T of clock pulses), the count number N during the period T4 represents directly the digital value of the unknown analog voltage $V_{IN}$. As will be evident from the foregoing the precision of the A-D conversion is independent of the precision of the threshold voltage Vc of the comparator 23.

Figure 6:
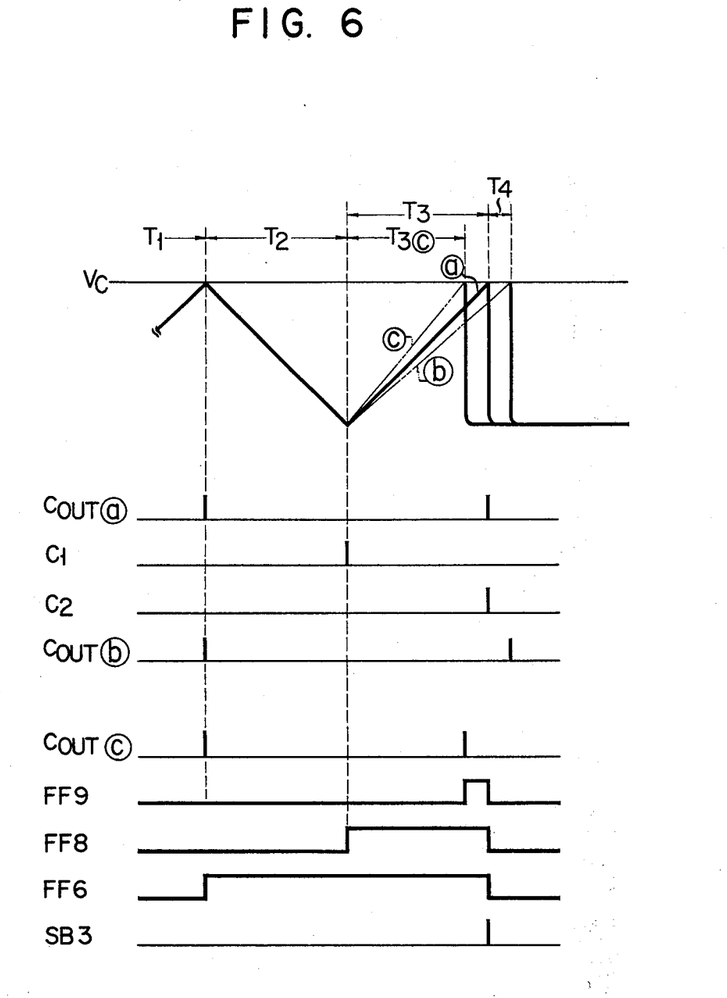
FIG. 6 shows a set of waveforms illustrating the operation of the FIG. 3 converter when an unknown analog signal is closer in magnitude to a first reference voltage.

In FIG. 6, there is shown an integrated waveform (b) obtained when the analog input voltage is close to the first reference voltage GND, an integrated waveform (c) obtained when the analog input voltage is slightly lower than the first reference voltage GND, that is, in the case of an underrange input, and other signal waveforms.

The conversion method according to the invention will be detailed with reference to the drawing.

Since there is provided the time period T2 during which the difference between second reference voltage $V_R$ and $V_M$ is integrated, when the analog input voltage $V_{IN}$ approximates the first reference voltage, i.e. ground potential, the integrator output voltage rises from a voltage level sufficiently lower than the threshold level Vc of the comparator 23 during the time period T3, as shown by the waveform (b) is FIG. 6. Therefore, the invention successfully eliminates erroneous operation of the comparator due to existence of the integration waveform near the threshold voltage level Vc, unlike the conventional A-D converter. Namely, according to the invention, an unknown analog voltage which is nearly equal to ground voltage can be measured with high precision.

Even when the unknown analog input voltage is slightly lower than the first referenced voltage, or ground voltage, the A-D converter of the invention can carry out A-D conversion and produce a corresponding digital output. The ramp waveform (c) in FIG. 6 shows an integration of such an input voltage. During the period T3 (c), the output voltage of the integrator 20 has a slope expressed by $(\frac{1}{2} V_R - V_{IN})/RC$. This slope is larger than that of the waveform (a) obtained when $V_{IN} = 0$ because $V_{IN}$ is slightly negative. Accordingly, the integrator output crosses the threshold voltage Vc of the comparator 23 prior to the time the counter 31 in FIG. 4 produces the second timing control pulse C2, so that the comparator output $C_{out}$ (c) in FIG. 6 is produced before the counter 31 produces the output C2. Accordingly, the output $C_{out}$ (c) is produced when the output Q of the flip-flop FF8 is HIGH and therefore the flip-flop FF9 is set through the gate G11. The clock pulse $C_p$ is applied to the counter 32 through the gate G9 so that the counter 32 initiates its counting operation. The counter 32 has been cleared by the start signal START and the counting starts from zero.

At the occurence of the comparator output $C_{out}$ of HIGH level, the output signal of the gate G11 resets the flip-flop FF3 through the gate G17 and sets the flip-flop FF4. Accordingly, the integrating operation terminates and the integrator operates as a voltage follower. The counter 31 continues its counting and, when it produces the pulse C2 the flip-flop FF9 is reset by the pulse C2 through the gate G12 and thus the gate G9 is disabled to terminate counting of the counter 32. At this time, a negative-going edge detection circuit SB3 (FIG. 4) connected to the output Q of flip-flop FF9 operates to produce an output as shown in FIG. 6. The flip-flop FF6 is reset by the output of detection circuit SB3 through the gate G5 to disable the AND gate G6 and thus the counter 31 also stops its operation of counting.

From the foregoing, it will be evident that even when the unknown analog input voltage is slightly lower than the first reference voltage, A-D conversion is possible and, by the HIGH level output of the flip-flop FF9 it may be indicated that the unknown analog input voltage is in an underrange condition. And the count number of the counter 32 represents a digital value corresponding to the difference between the first reference voltage and the unknown analog voltage.

The ramp waveform (a) in FIG. 6 is an integrated waveform when the unknown analog input voltage is equal to the first reference voltage. In this case, the pulse C2 and the comparator output $C_{out}$ are simultaneously produced.

In connection with FIG. 7, an explanation will be given of the case where the input analog voltage is slightly higher than the second reference voltage $V_R$, defining an overrange condition, wherein A-D conversion is possible and a digital value corresponding to the difference between the analog input voltage and the reference voltage $V_R$ can be obtained.

Figure 7:
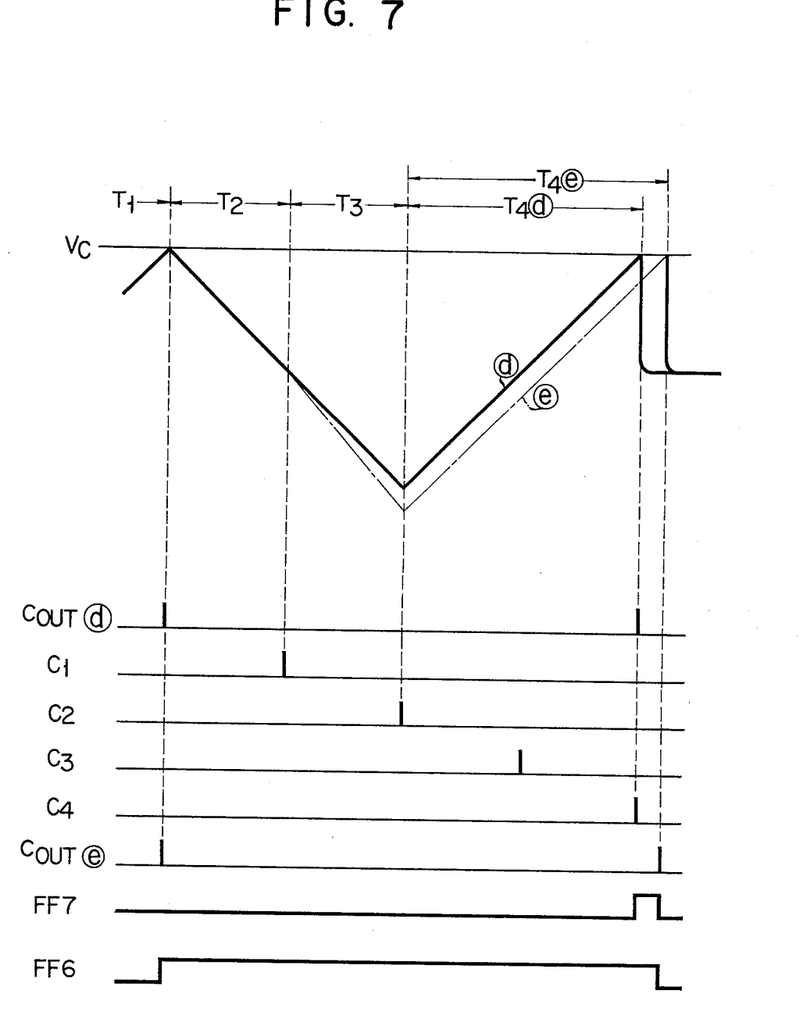
FIG. 7 illustrates a set of waveforms illustrating the operation of the FIG. 3 converter when an unknown analog signal is equal and closer in magnitude to a second reference voltage.

The waveform (d) in FIG. 7 is an integrated waveform when the analog input voltage $V_{IN}$ is equal to the second reference voltage $V_R$ and the waveform (e) is an integrated waveform when the analog input voltage $V_{IN}$ is slightly higher than the second reference voltage $V_R$.

During the period T3 for integrating the unknown analog input voltage, the output of the integrator 20 has a slope expressed by $(\frac{1}{2} V_R - V_{IN})/RC$. When $V_{IN}$ is slightly higher than $V_R$, the slope becomes more negative than that when $V_{IN} = V_R$, and thus the output of the integrator 20 crosses the voltage Vc of the comparator after the counter 31 produces the pulse $C_4$. Accordingly, the pulse $C_4$ sets the flip-flop FF7 so that the gate G9 is enabled through the gate G8 and thus the counter 32 commences counting the clock pulses Cp. As described above, at the time that the integrated waveform crosses the threshold voltage Vc, the output $C_{out}$ of the comparator becomes HIGH so that the flip-flop FF7 is reset through the gate G7 to disable the gate G9 through the gate G8. As a result, the counter 32 stops its counting. Therefore, the count number of the counter 32 represents the digital output corresponding to the exceeding amount of the input analog signal from the second reference voltage $V_R$.

From the foregoing description, it will be understood that the A-D converter of the invention has many advantages as mentioned below. An unknown analog input voltage $V_{IN}$ with the same polarity as that of the second reference voltage $V_R$ can be converted from analog to digital form. The A-D converter is driven by a single power supply voltage $V_{DD}$ with the same polarity as that of the second reference voltage $V_R$. For the employment of the minimum power supply voltage, the difference between the first voltage (ground voltage GND) and the second reference voltage may be used for the drive power source of the system. In other words, the first reference voltage may be the ground voltage and the second reference voltage may be the single drive voltage $V_{DD}$ of the system. This greatly improves the efficiency of the system power supply and further enables a ratiometric conversion. Any analog input voltage whose voltage lies between the first and second reference voltages can be A-D converted stably and precisely. Even when the analog input voltage is close to the first or second reference voltage, the integration waveform continuously changes so that a stable and precise A-D conversion is ensured. Additionally, A-D conversion is possible also in case where the analog input signal exceeds the input range, provided that the exceeding amount is within a given range. In this case, the exceeding amount is outputted in digital form through use of counter 32.

The features mentioned above are effective particularly when the A-D converter is integrated on a semiconductor substrate and thus provide an economical A-D converter system.

Figures 8, 9:
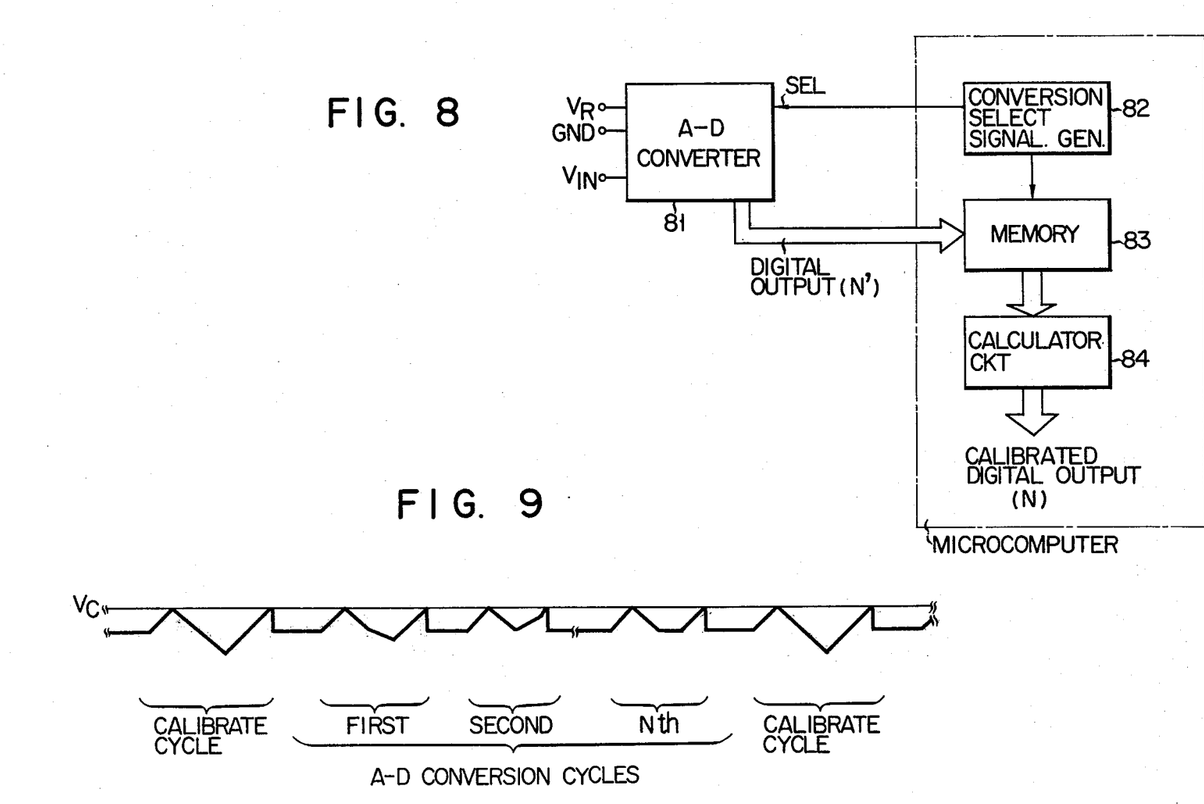
FIG. 8 is a block diagram showing another embodiment of the invention which can eliminate conversion error due to an input offset voltage applied to the integrator used in the A-D converter.
FIG. 9 shows waveforms illustrating the operation of the A-D converter of FIG. 8 including one calibration cycle and a series of conversion cycles.

Reference is now made to FIGS. 8 and 9 for explaining an A-D converter which can substantially eliminate conversion error due to an input offset voltage $V_{os}$ of the operational amplifier 19 constituting the integrator circuit 20.

In this example, one calibrating cycle is performed every time a series of unknown analog signals are converted in accordance with the above-described converting operation. In the calibrating cycle, the first or second reference voltage, instead of the unknown analog signal, is integrated during the period T3 in the converting cycle to obtain a digital value corresponding to the reference voltage. The digital value obtained is stored in a memory and the stored digital value is used to calibrate the measured digital values of the unknown analog signals on the basis of a given calibrating equation.

A selection of an ordinary conversion cycle or a calibrating cycle is made depending on the logical level of an output signal SEL of an A-D conversion selection signal generator 82. In the normal A-D conversion cycle as previously described with reference to FIG. 4, the selection signal SEL is HIGH in level. However, when the signal SEL is LOW in level, the gate G13 in the selection circuit SB1 is disabled and the gate G14 is enabled. When the output Q of the flip-flop FF3 is HIGH the control signal $\phi_1$ for the analog switch AS1 goes HIGH so that the second reference voltage $V_R$ is integrated. The calibrating cycle is the same as the A-D conversion cycle mentioned above, except that the second reference voltage $V_R$ is integrated instead of the unknown analog input voltage during the period T3. The integrated waveform is as shown in (d) of FIG. 7. Accordingly, the digital output N will equal 2T as seen from the equation (2) when a conversion error does not exist. However, when an offset voltage exists in the operational amplifier 19, the digital output N slightly deviates from 2T. In this embodiment, the deviated digital amount is temporarily stored in a memory circuit 83 and the digital output (denoted as N') obtained through the A-D converting cycle is calibrated in a calculator circuit 84 on the basis of a given calibrating equation to provide a correct digital amount N. In this case, the conversion selecting signal generator 82, the memory 83, and the calculator 84 may be provided separately from the main circuit A-D converter in FIG. 3. That is to say, a separate circuit device may be used for these circuit components in FIG. 8, independently from the main circuit. For example, when the A-D converter is used in a data collecting system using a microcomputer, the circuits 82 to 84 may be incorporated into the microcomputer and, in this case, may be controlled by software.

The following describes the calibrating equation. In FIG. 3, the input offset voltage may be considered to occur between the non-inverting and inverting input terminals of operational amplifier 19. Namely, since the medium voltage $V_M (\frac{1}{2} V_R)$ is applied to the non-inverting input terminal, the potential at the inverting input terminal may be considered $\frac{1}{2} V_R - V_{os}$. The influence of the offset voltage upon the A-D conversion is derived from the condition that the integrator output 28 is at the same potential Vc at the end of the period T1 and at the end of the period T4. Namely, $$\frac{-\frac{1}{2}V_R - V_{os}}{RC} T + \frac{-V_{IN} + \frac{1}{2}V_R - V_{os}}{RC} T + \frac{\frac{1}{2}V_R - V_{os}}{RC} N' = 0$$

where R is the resistance of the integrating resistor 21, C is the capacitance of the integrating capacitor 22, T is the count (T2=T3) which is equivalent to the duration of the period T2 or T3, and N' is the count equivalent to the time duration of the period T4 under influence of the offset voltage Vos. Accordingly, $$V_{IN} = \frac{V_R}{2T} N' - \frac{N'}{T} V_{os} - 2V_{os} \quad (3)$$

As described above, if the calibrating cycle is selected by the conversion selection signal SEL, since the left side $V_{IN}$ of equation (3) is equal to the second reference voltage $V_R$, the digital amount obtained during the calibrating cycle is extremely close to 2T. Assuming the difference is designated by $\underline{n}$, the count N' is $$N' = 2T + n \quad (4)$$

By substituting the equation (4) into (3), the digital value corresponding to the offset voltage is given $$V_{os} = \frac{\frac{n}{2}}{4T + n} V_R \approx \frac{n}{8T} V_R \quad (5)$$

If the calibrating digital amount $\underline{n}$ (including symbol) is loaded into the memory circuit 83 during the calibrating cycle, the digital outputs N' corresponding to a series of analog input voltages $V_{IN}$ may be determined the calculating circuit by using the equation (3).

From the equation (3) and (4), we have $$V_{IN} = \frac{V_R}{2T} \left( N' - \frac{N'}{4T} n - \frac{n}{2} \right) \quad (6)$$

The parenthesized term on the right side of the equation (6) corresponds to the digital output N which is determined independent of the offset voltage.

$$N = N' - \frac{N'}{4T} n - \frac{n}{2} \quad (7)$$

Therefore, the equation (7) is the given calibrating equation. In short, the difference $\underline{n}$ between the digital output N' for the second reference voltage $V_R$ obtained through the A-D conversion in the calibration cycle and the ideal digital value 2T is stored and the digital outputs N' for a series of unknown analog input voltages are measured. The corrected digital output N free from the offset voltage Vos may then be obtained by use of equation (7). The difference n may be obtained by subtracting the digital value N' measured corresponding to the actual reference voltage $V_R$ from the known correct digital value 2T corresponding to the desired $V_R$.

As described above, the A-D converting system of the invention can eliminate error due to the offset voltage Vos or a temperature drift. When the A-D converter is used in a data collecting system using a microcomputer, the hardware for calibration may be incorporated into the microcomputer and therefore data processing by software is permitted. Further, the A-D converter may be assembled into a microprocessor unit of the microcomputer. In this case, the control circuit section 26 and the counter circuit section 27 may be replaced by the corresponding circuit sections of the microcomputer.

Figure 10:
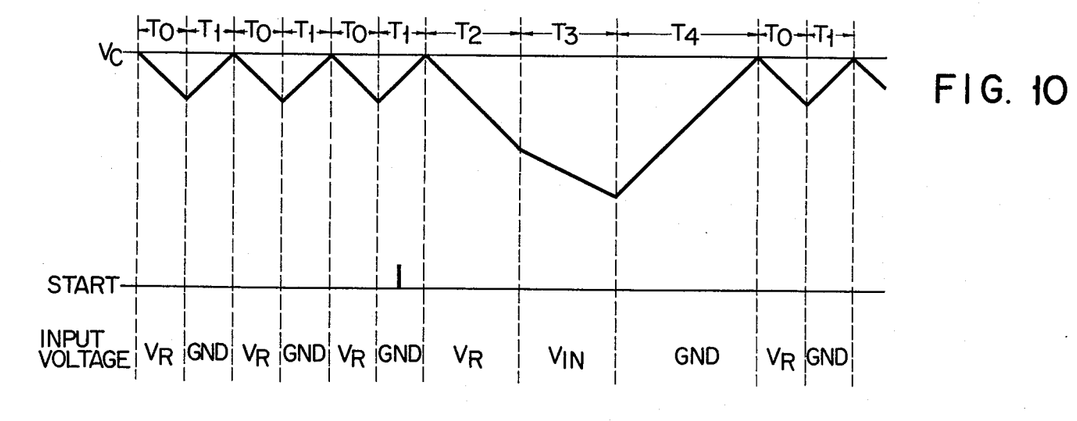
FIGS. 10 and 11 each show a set of waveforms illustrating the operation of modifications of the A-D converter according to the invention.
Figure 11:
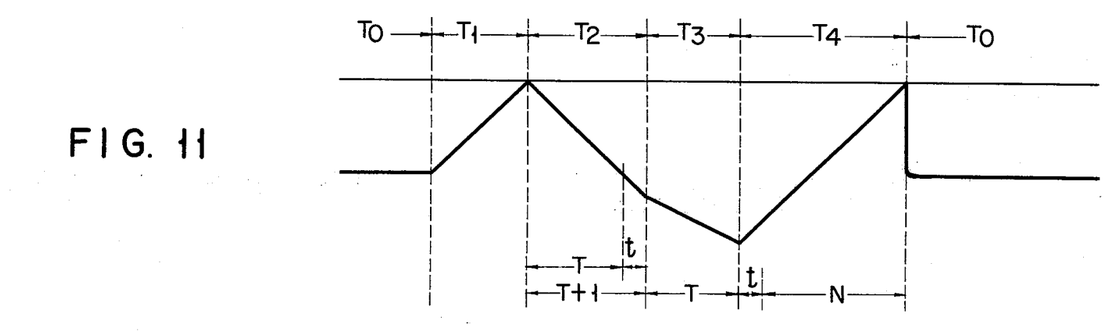

The A-D converter according to the invention is not limited to the embodiment mentioned above but it may be modified or changed in various ways within the scope of the invention. Although, in the above example, the integrator circuit is operated as a voltage follower when it is not used for A-D conversion, the first and second reference voltages may alternately be applied to the integrator. Integration waveforms in this example are shown in FIG. 10. In this example, the analog switch AS4 connected across the integrating capacitor is not necessary. Further, the durations of the converting cycle periods T2 and T3 may be slightly different. For example, the duration of the period T2 may be set T+t and the duration of the period T3 may be set T as shown in FIG. 11. The starting point that the counter starts counting of the count N during the period T4 may be set after time t from the start of the period T4.

What we claim is:

1. An analog-to-digital converter comprising:
an integrator having first and second inputs and powered from first and second potentials for integrating a difference between input voltages applied to said first and second inputs, said first input being supplied with a medium voltage between a first reference voltage and a second reference voltage of which the magnitude is larger than the first reference voltage;
a comparator powered from said first and second potentials for comparing the output voltage of said integrator with a comparison reference voltage, the magnitude of the comparison reference voltage ranging between said first and second potentials;
switching means connected to said second input of said integrator and selectively applying said first reference voltage, said second reference voltage, and an unknown analog signal to said second input of said integrator;
means for setting the output of said integrator to the level of said comparison reference voltage at the start of an integrating operation;
clock means for producing clock pulses and timing control pulses at predetermined time intervals from the point of time that said integrator commences its integration operation;
means for causing said switching means to couple said second reference voltage to said second input of said integrator during a first period with a given duration, said first period terminating upon occurrence of a first timing control pulse;
means responsive to the occurrence of said first timing control pulse to cause said switching means to couple said unknown analog signal to said second input of said integrator during a second period, said second period terminating when the output voltage of said integrator reaches said comparison reference voltage when said unknown analog signal is smaller in magnitude than said first reference voltage and upon occurrence of a second timing control pulse when said unknown analog signal is larger in magnitude than said first reference voltage;
means responsive to the occurrence of said second timing control pulse to cause said switching means to couple said first reference voltage to said second input of said integrator during a third period, said third period terminating when the output voltage of said integrator equals said comparison reference level;
first counting means for counting the number of clock pulses occurring during said third period to provide a digital value corresponding to said unknown analog signal; and second counting means for counting, when said unknown analog signal is smaller than the first reference voltage, the clock pulses occurring during a time interval in said second period from the time the output voltage of said integrator reaches said comparison reference voltage level to the time said second timing control pulse occurs to provide a digital value corresponding to the difference between said unknown analog signal and said first reference voltage.

2. An analog-to-digital converter according to claim 1, in which said first and second reference voltages are equal to said first and second potentials for said integrator, respectively.

3. An analog-to-digital converter according to claim 1 or 2, in which said first reference voltage is ground voltage.

4. An analog-to-digital converter according to claim 1, in which said means for conditioning said integrator to initiate its integration operation from said comparison reference voltage level is porvided with means for operating said integrator as a voltage follower before said integration operation is started.

5. An analog to digital converter according to claim 1, in which the polarity of said unknown analog signal is the same as that of said second reference voltage considered with respect to said first reference voltage.

6. An analog-to-digital converter comprising:
an integrator having first and second inputs and powered from first and second potentials for integrating a difference between input voltages applied to said first and second inputs, said first input being supplied with a medium voltage between a first reference voltage and a second reference voltage of which the magnitude is larger than said first reference voltage;
a comparator powered from said first and second potentials for comparing the output voltage of said integrator with a comparison reference voltage, the magnitude of said comparison reference voltage ranging between said first and second potentials;
switching means connected to said second input of said integrator and selectively applying said first reference voltage, said second reference voltage, and an unknown analog signal to said second input of said integrator; means for setting the output of said integrator to the level of said comparison reference voltage at the start of an integrating operation;
clock means for producing clock pulses and timing control pulses at predetermined time intervals from the point of time that said integrator commences its integration operation;
means for causing said switching means to couple said second reference voltage to said second input of said integrator during a first period with a given duration, said first period terminating upon occurrence of a first timing control pulse;
means responsive to the occurrence of said first timing control pulse to cause said switching means to couple said unknown analog signal to said second input of said integrator during a second period, said second period terminating upon occurrence of a second timing control pulse;
means responsive to the occurrence of said second timing control pulse to cause said switching means to couple said first reference voltage to said second input of said integrator during a third period, said third period terminating when the output voltage of said integrator equals said comparison reference level;
first counting means for counting the number of clock pulses occurring during said third period to provide a digital value corresponding to said unknown analog signal; and
second counting means for counting, when said unknown analog signal is larger than said second reference voltage, the clock pulses occurring during a time interval in said third period from the time that a third timing control pulse occurs to the time that the output voltage of said integrator reaches said comparison reference level, to provide a digital value corresponding to the difference between the magnitude of said unknown analog signal and that of said second reference voltage.

7. An analog-to-digital converter comprising:
integrating means having first and second inputs, said second input being connected to an integrating resistance;
a first switch for selectively coupling a first reference voltage to said integrating resistance to apply said voltage to said integrating means through said resistance;
a second switch for selectively coupling a second reference voltage to said integrating resistance to apply said voltage to said integrating means;
a third switch for selectively coupling an unknown voltage to said integrating resistance to apply said voltage to said integrating means;
means for applying a reference voltage having a magnitude between said first and second reference voltages to said first input of said integrating means;
voltage comparator means coupled to the output of said integrating means and including means for establishing a threshold voltage lying between said first and second reference voltages, said comparator means being constructed and arranged to produce an output signal when the output of said integrating means equals said threshold voltage;
a source of clock pulses;
control means responsive to said clock signals and to said comparator output signal for generating a series of timing signals to close said switches in a non-overlapping sequence such that said reference voltages and said unknown voltage are applied to said integrating means in a predetermined order during an A/D conversion cycle, said sequence comprising (1) the closing of said first switch for a first interval terminated by the occurrence of said comparator output signal whereby said first reference voltage is integrated to set the output of said integrating means to said threshold voltage, (2) the closing of said second switch for a second interval to set the output of said integrating means to a voltage intermediate said first and second reference voltages, (3) the closing of said third switch for a third interval to integrate said unknown voltage, and (4) the closing of said first switch for a fourth interval terminated by the occurrence of said comparator output signal, whereby the output of said integrating means is returned to said threshold voltage;
output means for timing the duration of said fourth interval to produce a digital output representing the magnitude of said unknown voltage;

further means included in said control means for generating a control pulse when a comparator output signal is produced while said third switch is closed, said control pulse operating to open said third switch and to inhibit the reclosing of said first switch; and additional means included in said output means and being responsive to said control pulse for indicating that said unknown voltage is an out of range voltage not falling in the voltage range between said first and second reference voltages and for timing the duration of the interval between the occurrence of said control pulse and the termination of a predetermined interval following the start of said third interval, whereby said additional means produces a digital output representing the amount by which said unknown voltage lies outside said voltage range.

8. An analog-to-digital converter comprising:

integrating means having first and second inputs, said second input being connected to an integrating resistance;

a first switch for selectively coupling a first reference voltage to said integrating resistance to apply said voltage to said integrating means through said resistance;

a second switch for selectively coupling a second reference voltage to said integrating resistance to apply said voltage to said integrating means;

a third switch for selectively coupling an unknown voltage to said integrating resistance to apply said voltage to said integrating means;

means for applying a reference voltage having a magnitude between said first and second reference voltages to said first input of said integrating means;

voltage comparator means coupled to the output of said integrating means and including means for establishing a threshold voltage lying between said first and second reference voltages, said comparator means being constructed and arranged to produce an output signal when the output of said integrating means equals said threshold voltage;

a source of clock pulses;

control means responsive to said clock signals and to said comparator output signal for generating a series of timing signals to close said switches in a non-overlapping sequence such that said reference voltages and said unknown voltage are applied to said integrating means in a predetermined order during an A/D conversion cycle, said sequence comprising (1) the closing of said first switch for a first interval terminated by the occurrence of said comparator output signal whereby said first reference voltage is integrated to set the output of said integrating means to said threshold voltage, (2) the closing of said second switch for a second interval to set the output of said integrating means to a voltage intermediate said first and second reference voltages, (3) the closing of said third switch for a third interval to integrate said unknown voltage, and (4) the closing of said first switch for a fourth interval terminated by the occurrence of said comparator output signal, whereby the output of said integrating means is returned to said threshold voltage;

output means for timing the duration of said fourth interval to produce a digital output representing the magnitude of said unknown voltage;

further means included in said control means for generating a control pulse when a comparator output signal fails to occur within a predetermined interval following the start of said fourth interval; and additional means included in said output means and being responsive to said control pulse for indicating that said unknown voltage is an out of range voltage not falling in the voltage range between said first and second reference voltages and for timing the duration of the interval between the occurrence of said control pulse and the termination of said fourth interval, whereby said additional means produces a digital output representing the amount by which said unknown voltage lies outside said voltage range.

* * * * *